(12) United States Patent
Baek et al.

(10) Patent No.: US 11,169,629 B2
(45) Date of Patent: Nov. 9, 2021

(54) TOUCH SCREEN AND DISPLAY DEVICE HAVING THE SAME

(71) Applicant: Samsung Display Co., Ltd., Yongin-Si (KR)

(72) Inventors: Ji Yeon Baek, Yongin-si (KR); Mi Young Kim, Yongin-si (KR); Chang Bum Kim, Yongin-si (KR); Jung Mok Park, Yongin-si (KR); Young Seok Yoo, Yongin-si (KR); Byeong Kyu Jeon, Yongin-si (KR); Hee Yeon Choi, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/386,203

(22) Filed: Apr. 16, 2019

(65) Prior Publication Data
US 2020/0089347 A1 Mar. 19, 2020

(30) Foreign Application Priority Data
Sep. 18, 2018 (KR) .......................... 10-2018-0111824

(51) Int. Cl.
*G06F 3/041* (2006.01)
*H01L 27/32* (2006.01)

(52) U.S. Cl.
CPC .......... *G06F 3/041* (2013.01); *H01L 27/3276* (2013.01)

(58) Field of Classification Search
None
See application file for complete search history.

(56) References Cited

U.S. PATENT DOCUMENTS

| 9,921,414 | B2 | 3/2018 | Kwon et al. | |
|---|---|---|---|---|
| 9,996,115 | B2 * | 6/2018 | Yamazaki | G09G 5/003 |
| 2002/0054261 | A1 * | 5/2002 | Sekiguchi | G06F 3/0488 |
| | | | | 349/122 |
| 2003/0026967 | A1 * | 2/2003 | Joseph | D04H 3/02 |
| | | | | 428/292.1 |
| 2003/0211291 | A1 * | 11/2003 | Castiglione | B32B 7/02 |
| | | | | 428/172 |
| 2008/0231791 | A1 * | 9/2008 | Tanabe | G06F 3/0421 |
| | | | | 349/150 |

(Continued)

FOREIGN PATENT DOCUMENTS

KR 10-2017-0000030 A 1/2017

*Primary Examiner* — Patrick N Edouard
*Assistant Examiner* — Peijie Shen
(74) *Attorney, Agent, or Firm* — Innovation Counsel LLP

(57) ABSTRACT

A touch screen and a display device having the same are disclosed. The touch screen includes an insulating substrate including a sensing region and a peripheral region, a plurality of sensing electrodes disposed in the sensing region, a plurality of wirings disposed in the peripheral region and electrically connected to the plurality of sensing electrodes, a plurality of pads disposed in the peripheral region and electrically connected to the plurality of wirings, an optical film disposed on an upper portion of the plurality of sensing electrodes, a flexible circuit board electrically connected to the plurality of pads, and a reinforcing member disposed on the flexible circuit board corresponding to the plurality of pads, wherein a first height measured from the insulating substrate to an upper surface of the reinforcing member is equal to a second height measured from the insulating substrate to an upper surface of the optical film.

16 Claims, 5 Drawing Sheets

(56) References Cited

U.S. PATENT DOCUMENTS

| | | | | |
|---|---|---|---|---|
| 2012/0017433 | A1* | 1/2012 | Chung | G06F 3/0446 |
| | | | | 29/829 |
| 2012/0098736 | A1* | 4/2012 | Yee | G09F 9/33 |
| | | | | 345/76 |
| 2012/0105344 | A1* | 5/2012 | Ko | G06F 3/0446 |
| | | | | 345/173 |
| 2012/0313884 | A1* | 12/2012 | Huang | G06F 3/0446 |
| | | | | 345/174 |
| 2013/0095885 | A1* | 4/2013 | Liu | H04M 1/22 |
| | | | | 455/556.1 |
| 2014/0014960 | A1* | 1/2014 | Yamazaki | H01L 27/3244 |
| | | | | 257/59 |
| 2014/0131075 | A1* | 5/2014 | Jang | H05K 1/0296 |
| | | | | 174/255 |
| 2014/0177176 | A1* | 6/2014 | Torii | H05K 1/0259 |
| | | | | 361/748 |
| 2014/0225871 | A1* | 8/2014 | Kim | G06F 3/0412 |
| | | | | 345/176 |
| 2015/0346881 | A1* | 12/2015 | Watazu | G06F 3/045 |
| | | | | 345/174 |
| 2016/0147361 | A1* | 5/2016 | Ahn | G09G 3/20 |
| | | | | 345/173 |
| 2018/0150179 | A1* | 5/2018 | Moon | G06F 3/0446 |
| 2018/0197885 | A1* | 7/2018 | Lee | H01L 23/544 |
| 2018/0356921 | A1* | 12/2018 | Ye | G06F 3/0412 |
| 2019/0086760 | A1* | 3/2019 | Wang | G02F 1/133305 |
| 2019/0259818 | A1* | 8/2019 | Jeon | H01L 51/5253 |

\* cited by examiner

TOUCH SCREEN AND DISPLAY DEVICE HAVING THE SAME

CROSS-REFERENCE TO RELATED APPLICATION

The application claims priority from and the benefit of Korean Patent Application No. 10-2018-0111824, filed Sep. 18, 2018, which is hereby incorporated by reference for all purposes as if fully set forth herein.

BACKGROUND

Field

Exemplary embodiments of the present disclosure relate to a touch screen and a display device having the same, and more particularly, to a touch screen and a display device having the same having improved appearance quality, durability, and reliability.

Description of Related Art

Flat panel displays such as liquid crystal displays (LCDs) and organic light emitting displays are thin and light weight. Due to their thinness and light weight, applications and ranges of use for the flat panel displays are gradually expanding.

In recent years, flat panel displays having an integrated touch screen have been introduced and widely adopted due to their convenience of use and high demands for various applications.

Since the flat panel displays having a touch screen have complicated structures and are expensive to manufacture, it is necessary to develop a technology that is capable of reducing a defect rate and increasing yields in a manufacturing process.

The above information disclosed in this section is only for understanding the background of the inventive concepts, and therefore, may contain information that does not form a prior art.

SUMMARY

One or more exemplary embodiments of the present disclosure provide a touch screen in which an adhesion of a flexible circuit board to a pad portion can be improved.

One or more exemplary embodiments of the present disclosure also provide a display device in which appearance quality can be improved.

According to some exemplary embodiments, a touch screen may include an insulating substrate including a sensing region and a peripheral region; a plurality of sensing electrodes disposed in the sensing region of the insulating substrate; a plurality of wirings disposed in the peripheral region of the insulating substrate and electrically connected to the plurality of sensing electrodes; a plurality of pads disposed in the peripheral region of the insulating substrate and electrically connected to the plurality of wirings; an optical film disposed on an upper portion of the plurality of sensing electrodes; a flexible circuit board electrically connected to the plurality of pads; and a reinforcing member disposed on the flexible circuit board corresponding to the plurality of pads, wherein a first height measured from the insulating substrate to an upper surface of the reinforcing member may be equal to a second height measured from the insulating substrate to an upper surface of the optical film.

The optical film may be spaced apart from the flexible circuit board by a predetermined distance.

A thickness of the optical film may be greater than that of the reinforcing member.

The optical film may include a polarizing film.

One end of the reinforcing member may coincide with an outer edge of the insulating substrate.

The reinforcing member may be a double sided tape.

The touch screen may further include an anisotropic conductive film interposed between the plurality of pads and the flexible circuit board.

According to some exemplary embodiments, a display device may include a display panel displaying an image; a touch screen disposed on the display panel; an optical adhesive layer disposed on the touch screen; and a window member disposed on the optical adhesive layer, wherein the touch screen may include an insulating substrate including a sensing region and a first peripheral region; a plurality of sensing electrodes disposed in the sensing region of the insulating substrate; a plurality of wirings disposed in the first peripheral region of the insulating substrate and electrically connected to the plurality of sensing electrodes; a plurality of pads disposed in the first peripheral region of the insulating substrate and electrically connected to the plurality of wirings; an optical film disposed on an upper portion of the plurality of sensing electrodes; a first flexible circuit board electrically connected to the plurality of pads; and a reinforcing member disposed on the first flexible circuit board corresponding to the plurality of pads, wherein a first height measured from the insulating substrate to an upper surface of the reinforcing member may be equal to a second height measured from the insulating substrate to an upper surface of the optical film.

The optical film may be spaced apart from the first flexible circuit board by a predetermined distance.

A thickness of the optical film may be greater than that of the reinforcing member.

The optical film may include a polarizing film.

One end of the reinforcing member may coincide with an outer edge of the insulating substrate.

The reinforcing member may include an insulating material having a higher strength than the optical adhesive layer.

The reinforcing member may be a double sided tape.

The touch screen may further include an anisotropic conductive film interposed between the plurality of pads and the first flexible circuit board.

The display panel may include a first insulating substrate including a display region and a second peripheral region; a second insulating substrate facing the first insulating substrate; a display part disposed between the first insulating substrate and the second insulating substrate and displaying an image; and a second flexible circuit board for providing a signal for driving the display part, wherein the display region corresponds to the sensing region of the touch screen, and the second peripheral region corresponds to the first peripheral region of the touch screen, and wherein the first flexible circuit board of the touch screen may be electrically connected to the second flexible circuit board of the display panel.

BRIEF DESCRIPTION OF THE DRAWINGS

The accompanying drawings, which are included to provide a further understanding of the inventive concepts of the present disclosure, and are incorporated in and constitute a part of the present disclosure, illustrate exemplary embodi

DETAILED DESCRIPTION

Figure 1:
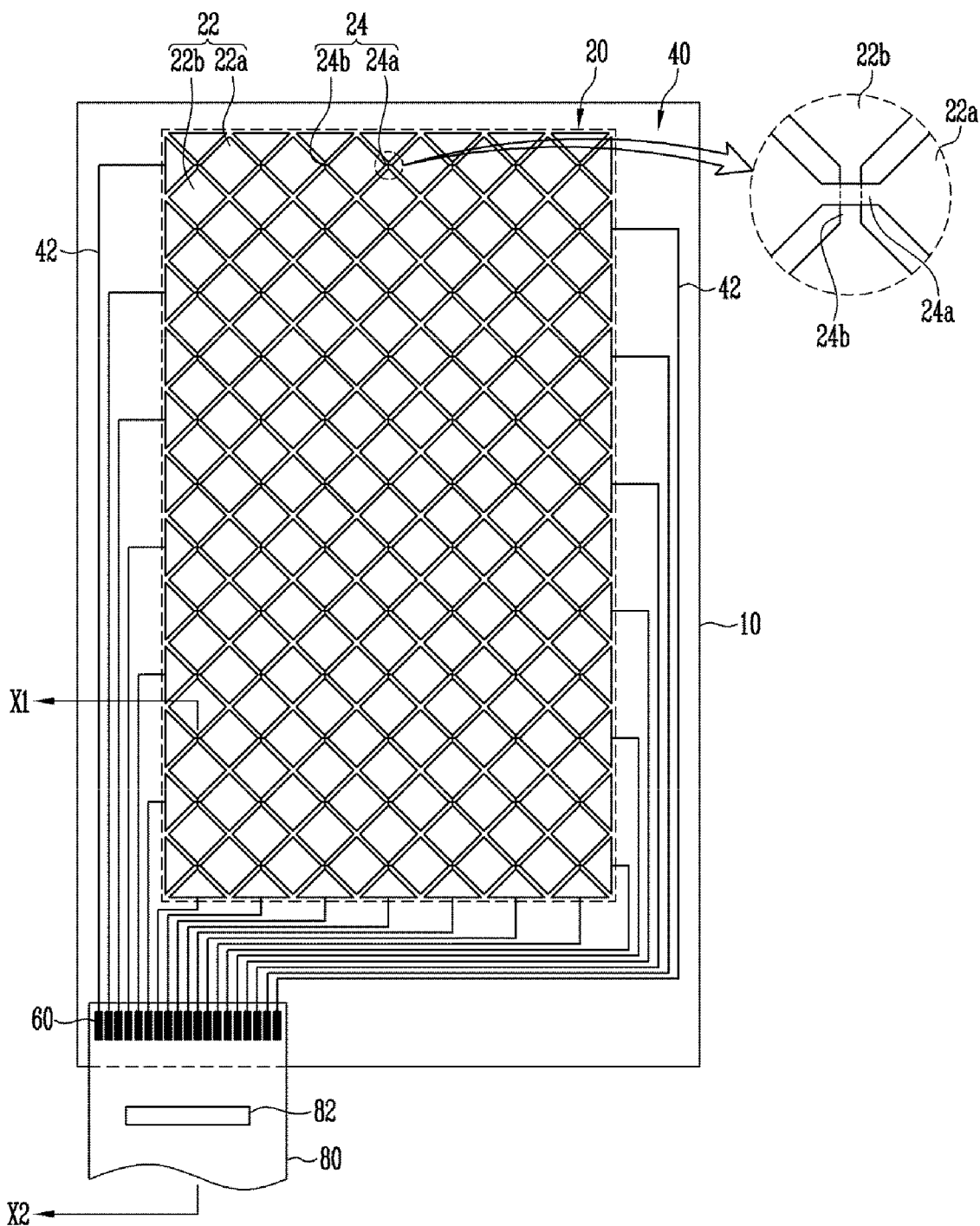
- FIG. 1 is a plan view of a touch screen according to a first embodiment of the present disclosure.

Hereinafter, exemplary embodiments of the present disclosure will be described in detail with reference to the accompanying drawings. The following embodiments are provided so that those skilled in the art will be able to fully understand the inventive concepts of the present disclosure. The embodiments can be modified in various ways. The scope of the present disclosure is not limited to the embodiments described below.

In the embodiments, the terms first, second, etc. are not used in a limiting sense and are used for the purpose of distinguishing one element from another. In addition, an expression representing a singular may include an expression representing a plurality unless it is explicitly stated differently in context.

Further, when a layer, a region, an element, or the like is referred to as being "connected" in the embodiment, it will be understood that when a layer, a region, or an element is directly connected as well as one or more layers, regions, or elements may be indirectly connected to each other. For example, when a layer, a region, an element, or the like is electrically connected, not only when a layer, a region, an element, or the like is directly connected each other, as well as a case where another layer, region, element, or the like may be interposed therebetween and indirectly connected thereto.

The sizes of the elements shown in the drawings may be exaggerated or reduced for convenience of explanation. For example, the size and thickness of each element may be arbitrarily shown for convenience of explanation, and thus the present disclosure is not necessarily limited to those shown in the drawings.

Figure 2:
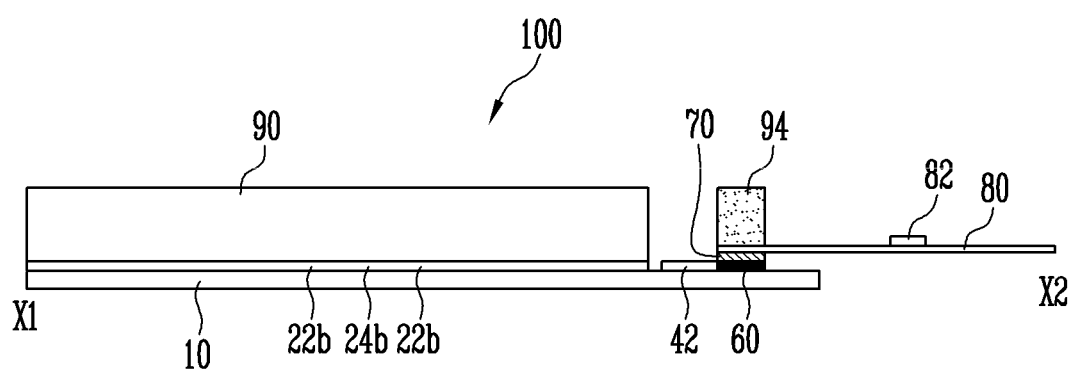
FIG. 2 is a cross-sectional view taken along line X1-X2 of FIG. 1.

FIG. 1 is a plan view of a touch screen according to a first embodiment of the present disclosure. FIG. 2 is a cross-sectional view taken along line X1-X2 of FIG. 1.

Referring to FIGS. 1 and 2, a touch screen 100 may include an insulating substrate 10, a touch sensing part and a signal input/output part that are disposed on the insulating substrate 10, and a flexible circuit board 80 electrically connected to the signal input/output part.

The insulating substrate 10 may include a sensing region 20 and a peripheral region 40.

The sensing region 20 may correspond to a central region of the insulating substrate 10, and the peripheral region 40 may correspond to an outer region of the sensing region 20. For example, the peripheral region 40 may surround the sensing region 20.

The insulating substrate 10 may be a rigid substrate made of a transparent material such as glass, quartz, and plastic in the form of a plate, or a flexible substrate made of a transparent plastic or the like in the form of a film. For example, the transparent glass may include aluminosilicate or soda lime, and the transparent plastic may include a polyimide resin, an acrylic resin, a polyacrylate resin, a polycarbonate resin, a polyether resin, a polyethylene terephthalate resin, a sulfonic acid resin, or the like.

The touch sensing part may include sensing electrodes 22 disposed in the sensing region 20 and connection patterns 24 that electrically connect the sensing electrodes 22 to each other.

The sensing electrodes 22 may include first sensing electrodes 22a arranged in a first direction (e.g., a row direction) and second sensing electrodes 22b arranged in a second direction (e.g., a column direction) that intersects the first direction.

The first sensing electrodes 22a and the second sensing electrodes 22b may be arranged in a plurality of rows and a plurality of columns in a matrix pattern without overlapping each other.

The sensing electrodes 22 may include a transparent conductive material such as indium tin oxide (ITO), zinc tin oxide (ZTO), gallium zinc oxide (GZO), carbon nanotubes (CNTs), and graphene. In addition, the sensing electrodes 22 may be formed in various shapes such as a rectangular shape, and a rhombic shape, and each shape may include a mesh structure.

The connection patterns 24 may include first connection patterns 24a that connect the first sensing electrodes 22a to each other in the first direction and second connection patterns 24b that connect the second sensing electrodes 22b to each other in the second direction.

The first connection patterns 24a and the second connection patterns 24b may intersect with each other and may be electrically insulated from each other by an insulating layer at each of the intersections therebetween.

The connection patterns 24 may be formed of a transparent conductive material as the sensing electrodes 22 or a metal having a higher conductivity than the transparent conductive material. Examples of the metal may include aluminum (Al), gold (Au), silver (Ag), copper (Cu), chromium (Cr), molybdenum (Mo), iron (Fe), molybdenum-tungsten (MoW), and nickel (Ni).

The signal input/output part may include wirings 42 that are disposed in the peripheral region 40 and pads 60 that are electrically connected to the wirings 42.

One end of each of the wirings 42 may be electrically connected to each of the first sensing electrodes 22a arranged in the plurality of rows or each of the second sensing electrodes 22b arranged in the plurality of columns. The other end of each of the wirings 41 may be electrically connected to each of the pads 60.

The wirings 42 may be formed of a transparent conductive material as the sensing electrodes 22, or a metal having high conductivity as the connection patterns 24. Alternatively, the wirings 42 may be formed as a laminated structure including a metal having high conductivity and a transparent conductive material.

The pads 60 may be disposed at one side of the peripheral region 40, for example, at one edge of the insulating substrate 10 to facilitate connection with the flexible circuit board 80. The pads 60 may be formed of the same material and layer as the wirings 42.

The flexible circuit board 80 may be electrically connected to the pads 60 by being pressed onto the pads 60 through, for example, an anisotropic conductive film 70 or the like.

The flexible circuit board 80 may electrically connect the touch screen 100 to an external driving circuit or a circuit board of a display device. The flexible circuit board 80 may include pads that correspond to the pads 60 of the touch screen 100 and wirings or circuitry. For example, the flexible circuit board 80 may be a flexible printed circuit board (FPCB) or the like.

In another embodiment, the flexible circuit board 80 may further include a driving circuit 82 that can drive the sensing electrode 22 and detect a position of a touch input on the touch screen 100.

According to one embodiment, the touch screen 100 is a capacitive type. When an object such as a human finger or a pen touches the sensing region 20, a change in capacitance at the position where the object is touched can be sensed by the sensing electrodes 22. The change of the capacitance is transferred to the driving circuit 82 via the wirings 42 and the pads 60, and the change of the capacitance is converted into an electrical signal to detect the touch position.

When the touch screen 100 according to the embodiment is applied to a display device, the touch screen 100 may further include an optical film 90 that is disposed on an upper portion including the sensing electrodes 22 and a reinforcing member 94 that is disposed on the flexible circuit board 80 corresponding to the pads 60.

The optical film 90 may be disposed only on the sensing region 20 that includes the sensing electrodes 22. Alternatively, the optical film 90 may be disposed on the upper portion of the sensing region 20 and a portion of the peripheral region 40. The optical film 90 may be spaced apart from the flexible circuit board 80 by a certain distance.

The optical film 90 may include a polarizing film, an anti-reflection film, or the like. A thickness of the optical film 90 may be greater than that of the reinforcing member 94.

The reinforcing member 94 may be in the form of a double-sided tape. The reinforcing member 94 may be thinner than the optical film 90. However, in a plan view, a first height of the reinforcing member 94 measured from the insulating substrate 10 to an upper surface of the reinforcing member 94 may be substantially equal to a second height of the optical film 90 measured from the insulating substrate 10 to an upper surface of the optical film 90. In addition, a strength of the reinforcing member 94 may be substantially similar to that of the optical film 90.

When the reinforcing member 94 is omitted, a gap between the optical film 90 and the flexible circuit board 80 and a step difference between the upper surface of the optical film 90 and the upper surface of the flexible circuit board 80 may cause poor surface flatness of the touch screen 100. In this state, when a window member is adhered to an upper portion of the touch screen 100 by an optical adhesive layer, a stain caused by to the step difference may be visually observed or a pressing mark may appear after the assembly of the window member onto the touch screen 100. Such defects can deteriorate an appearance quality of the display device.

To reduce the step difference, the optical film 90 may be disposed to extend to the upper portion of the flexible circuit board 80 corresponding to the pads 60. In this case, however, although a size of the gap and the step difference can be minimized, a size of the peripheral region 40 may be increased.

Embodiments of the present disclosure prevent the degradation of appearance quality that may be caused by the step difference without increasing the size of the peripheral region 40.

According to the embodiment shown in FIG. 2, the reinforcing member 94 can reduce or eliminate the step difference between the upper surface of the optical film 90 and the upper surface of the flexible circuit board 80. Therefore, when a window member is adhered to the upper portion of the touch screen 100 by the optical adhesive layer, no stains or pressing marks may be caused due to the step difference. In addition, the reinforcing member 94 may have a predetermined adhesive force and strength, and adhesion of the flexible circuit board 80 to the pads 60 can be reinforced by the reinforcing member 94.

According to the embodiment, a durability test of the touch screen 100 may be performed after the window member is adhered to the touch screen 100. For example, the durability test may include a peel off test to pull the flexible circuit board 80 in an opposite direction to the insulating substrate 10.

When a thickness of the reinforcing member 94 is 100 μm, the adhesion of the flexible circuit board 80 to the pads 60 is measured to be about 1.56 N/mm.

As a comparative example, the adhesion of the flexible circuit board 80 to the pads 60 is measured to be about 0.2 N/mm in the absence of the reinforcing member 94. This indicates that the pressing of the flexible circuit board 80 onto the pads 60 using reinforcing member 94 can greatly improve durability and reliability of the touch screen 100. As a result, the flexible circuit board 80 can be stably adhered to the pads 60, an electrical contact failure between the pads 60 and the flexible circuit board 80 can be effectively prevented, and reliability of the display device can be improved.

Figure 3:
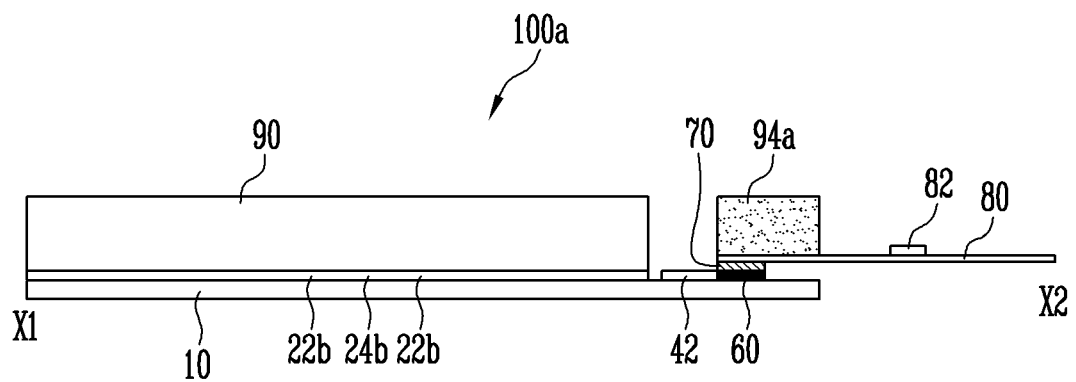
FIG. 3 is a cross-sectional view of a touch screen according to a second embodiment of the present disclosure.

FIG. 3 is a cross-sectional view of a touch screen 100a according to a second embodiment of the present disclosure.

The touch screen 100a of the present embodiment is similar to the touch screen 100 shown in FIG. 2 except that a reinforcing member 94a has a wider contact area with the flexible circuit board 80 than the reinforcing member 94 shown in FIG. 1.

The reinforcing member 94a may have a first side that is aligned with a side of the pads 60 that faces the optical film 90 and a second side that is aligned with an edge of the insulating substrate 10.

Because the reinforcing member 94a of FIG. 3 can be in contact with the flexible circuit board 80 in a wider area than the reinforcing member 94 of FIG. 2, the adhesion between the flexible circuit board 80 and the pads 60 can be further improved. In addition, a higher adhesive force between the reinforcing member 94a and the window member can be maintained.

The touch screens 100 and 100a according to these embodiment of the present disclosure can be integrated in a display device and used as an input device of the display device. In the following embodiments, the touch screen 100 of FIG. 2 will be mainly described as an example, however, it is understood that the touch screen 100a of FIG. 3 can be equally applied without deviating from the scope of the present disclosure.

Figure 4:
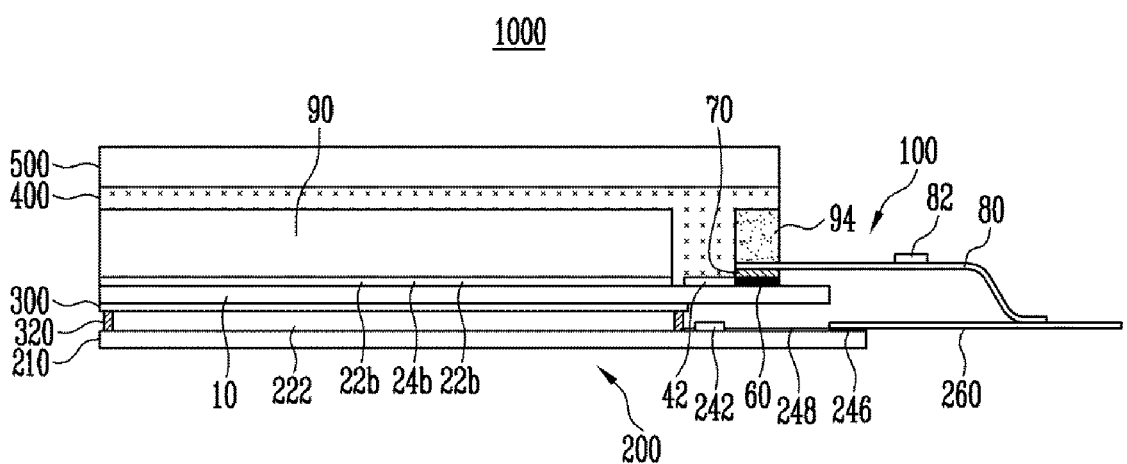
FIG. 4 is a cross-sectional view of a display device according to an embodiment of the present disclosure.
Figure 5:
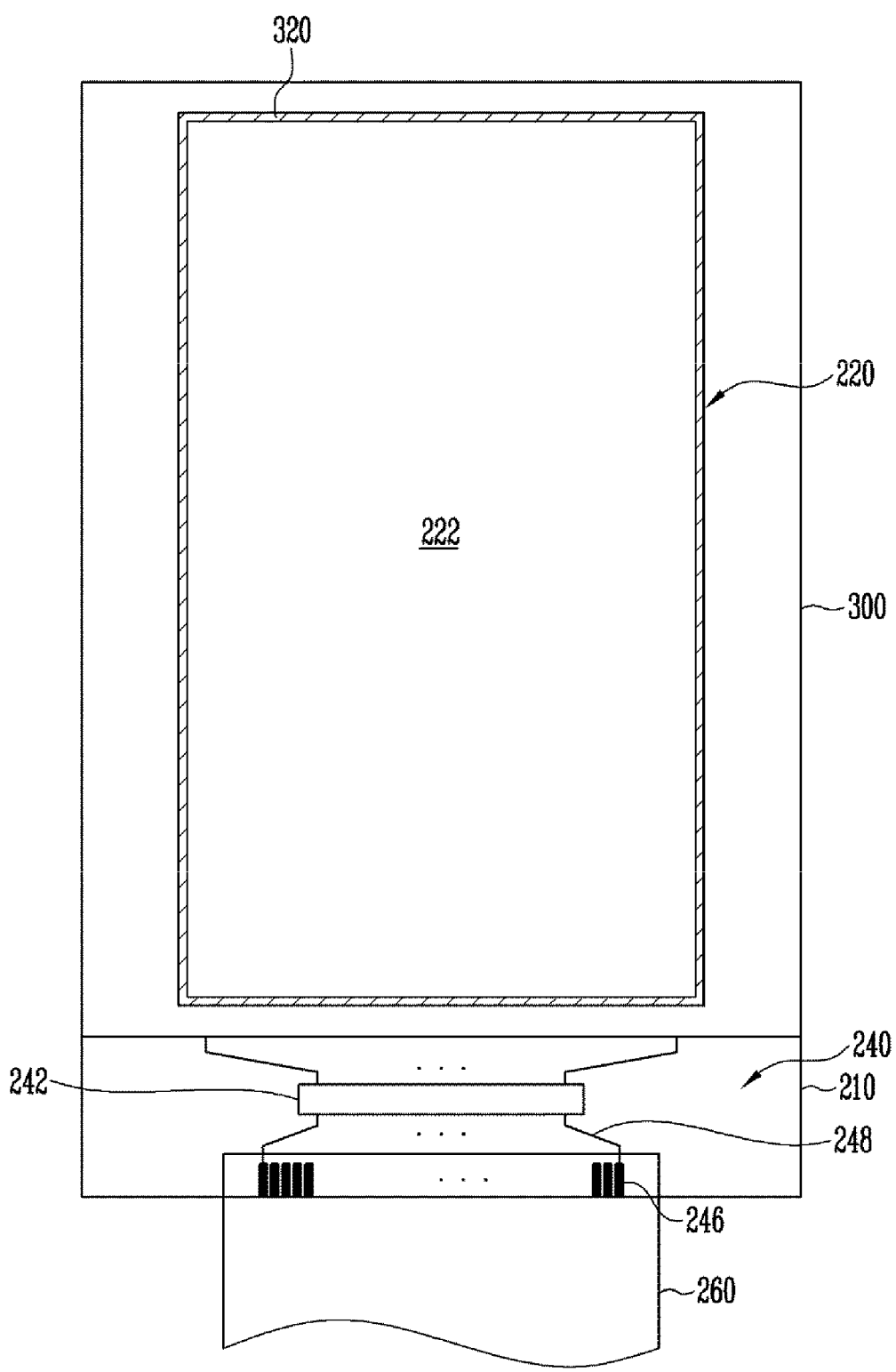
FIG. 5 is a plan view of the display device shown in FIG. 4.

FIG. 4 is a cross-sectional view of a display device according to an embodiment of the present disclosure, and FIG. 5 is a plan view of the display device shown in FIG. 4.

Referring to FIG. 4, a display device 1000 may include a display panel 200 for displaying an image, a touch screen 100 disposed on the display panel 200, an optical adhesive layer 400 disposed on the touch screen 100, and a window member 500 disposed on the optical adhesive layer 400.

Referring to FIGS. 4 and 5, the display panel 200 may include a first insulating substrate 210, a second insulating substrate 300 that faces the first insulating substrate 210, a display part 222 that is disposed between the first insulating substrate 210 and the second insulating substrate 300, and a flexible circuit board 260 that provides a signal to the driving the display part 222.

The first insulating substrate 210 may include a display region 220 and a peripheral region 240.

The display region 220 may correspond to a central region of the first insulating substrate 210, and the peripheral region 240 may correspond to an outer region of the display region 220. For example, the peripheral region 240 may surround the display region 220.

The display part 222 for displaying the image may be disposed in the display region 220 of the first insulating substrate 210. The peripheral region 240 of the first insulating substrate 210 may include pads 246 that are provided with a signal for driving the display part 222 from an outside and signal lines 248 that are electrically connected to the pads 246 and the display part 222. A driver 242 for generating a scan signal or a data signal for driving the display part 222 may be connected to an intermediate portion of the signal lines 248.

The second insulating substrate 300 may be disposed on the first insulating substrate 210 to overlap the display region 220 and at least a portion of the peripheral region 240.

The first insulating substrate 210 and the second insulating substrate 300 may be a rigid substrate made of a transparent material such as glass, quartz, and plastic in the form of a plate, or a flexible substrate made of a transparent plastic or the like in the form of a film. In addition, the second insulating substrate 300 may be replaced with an encapsulation layer that has a laminated structure including an organic layer and an inorganic layer.

The display part 222 may include a pixel array for displaying the image. The display part 222 may be sealed by a sealing material 320 that is interposed between the first insulating substrate 210 and the second insulating substrate 300 in the peripheral region 240 to surround the display part 222.

The pixel array may include a plurality of pixels connected in a matrix form between scan lines and data lines.

Each of the plurality of pixels may include a light emitting device and a pixel circuit for driving the light emitting device. The pixel circuit may include a thin film transistor for transmitting a signal to the light emitting device and a capacitor for maintaining the signal.

Figure 6:
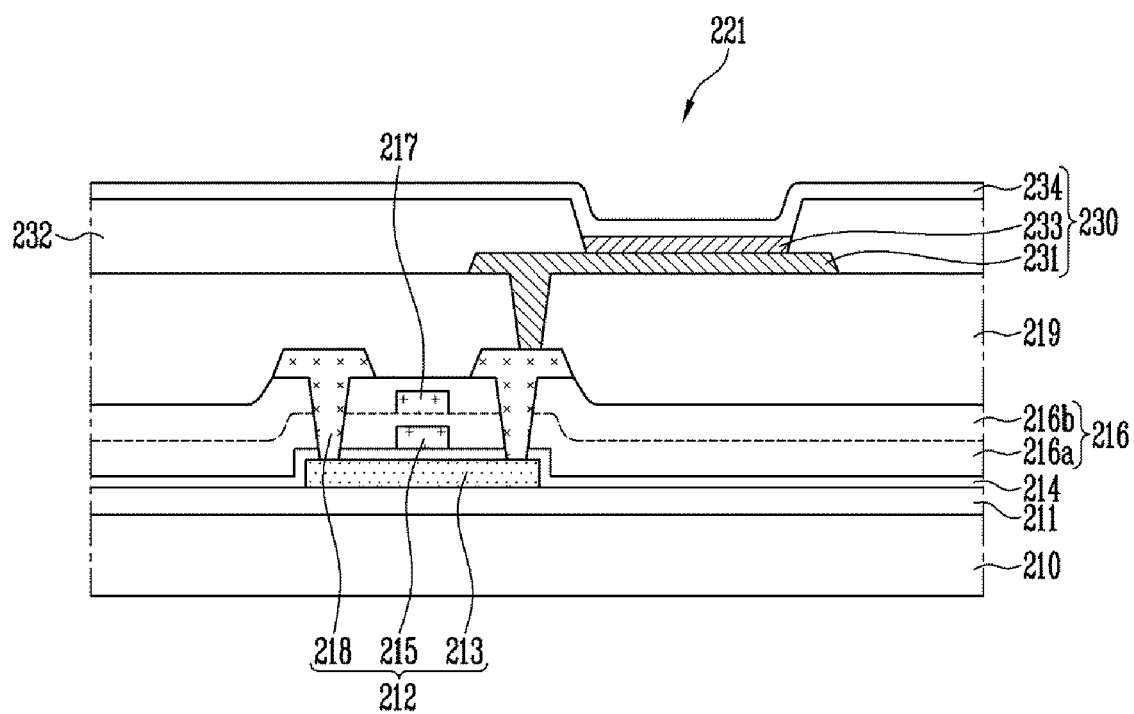
FIG. 6 is a cross-sectional view of a pixel applied to an embodiment of the present disclosure.

FIG. 6 is a cross-sectional view of a pixel applied to an embodiment of the present disclosure.

A pixel 221 may be disposed in the display region 220 of the first insulating substrate 210.

A buffer layer 211 may be disposed on the first insulating substrate 210 to prevent permeation of air and moisture from outside and planarize an upper surface of the first insulating substrate 210. A thin film transistor 212 may be disposed on the buffer layer 211.

The thin film transistor 212 may include a semiconductor layer 213 that includes a source region, a drain region and a channel region, a gate electrode 215 that is disposed on the semiconductor layer 213 overlapping the channel region and electrically insulated from the semiconductor layer 213 by a gate insulating layer 214, and source and drain electrodes 218 that are electrically connected to the source and drain regions of the semiconductor layer 213.

The source and drain electrodes 218 may be electrically connected to the source and drain regions of the semiconductor layer 213 through contact holes that are formed in an interlayer insulating layer 216.

The interlayer insulating layer 216 may include a first interlayer insulating layer 216a that is disposed on the semiconductor layer 213 and the gate insulating layer 214 and a second interlayer insulating layer 216b that is disposed on the first interlayer insulating layer 216a.

A capacitor electrode 217 may be disposed between the first interlayer insulating layer 216a and the second interlayer insulating layer 216b to overlap the gate electrode 215. The capacitor of the pixel circuit may be formed by the gate electrode 215, the first interlayer insulating layer 216a, and the capacitor electrode 217 that are disposed to overlap each other.

A light emitting device 230 including a first electrode 231, an organic layer 233, and a second electrode 234 may be disposed on an upper portion of the thin film transistor 212 and the capacitor. The light emitting device 230 may include, for example, an organic light emitting diode (OLED).

A planarization layer 219 may be disposed between the first insulating substrate 210 and the light emitting diode 230. The first electrode 231 of the light emitting diode 230 may be disposed on the planarization layer 219 and electrically connected to the source or drain electrode 218 through a via hole formed in the planarization layer 219.

A pixel defining layer 232 may be disposed on the planarization layer 219. The pixel defining layer 232 may be patterned to expose at least a portion of the first electrode 231. The organic layer 233 of the light emitting device 230 may be disposed on the exposed portion of the first electrode 231.

The organic layer 233 may include any one of a hole injecting layer (HIL), a hole transporting layer (HTL), an organic light emitting layer, an electron transporting layer (ETL), and an electron injecting layer (EIL). As another embodiment, the organic layer 233 may further include an auxiliary layer or an intermediate layer.

The second electrode 234 of the light emitting device 230 may be disposed on the pixel defining layer 232 and the organic layer 233. The first electrode 231 may be an anode electrode of the light emitting device 230, and the second electrode 234 may be a cathode electrode of the light emitting device 230.

Although an organic light emitting display device has been described in the above embodiments, the display device may be a liquid crystal display (LCD) device including a liquid crystal display layer.

Referring to FIGS. 4 and 5, the flexible circuit board 260 may be electrically connected to the pads 246 by being pressed onto the pads 246 through, for example, an anisotropic conductive film or the like.

The flexible circuit board 260 may electrically connect the display panel 200 to an external driving circuit or a circuit board of the display device 1000. The flexible circuit board 260 may include pads that correspond to the pads 246 of the display panel 200 and wirings or circuitry. The flexible circuit board 260 may be formed of, for example, a flexible printed circuit board (FPCB).

The display device 1000 according to the embodiment may include a controller. The controller may receive a synchronous signal and a clock signal from the outside, generate a control signal, and provide the control signal to the driver 242.

The pixel 221 is selected by the scan signal that is provided through the scan line, and the current flowing through the pixel 221 is controlled in accordance with the data signal that is provided through the data line so that each pixel 221 emits light having a predetermined brightness corresponding to the data signal.

The touch screen 100 may be disposed on an upper portion of the display panel 200.

The touch screen 100 may be disposed on the upper portion of the display panel 200 so that the sensing region 20 of the touch screen 100 corresponds to the display region 220 of the display panel 200. For example, the touch screen 100 may be adhered onto the display panel 200 by the optical adhesive layer 400. At this time, the flexible circuit board 80 of the touch screen 100 may be electrically connected to the flexible circuit board 260 of the display panel 200 as shown in FIG. 4.

The optical adhesive layer 400 may be formed on an upper surface of the touch screen 100, and the window member 500 may be adhered to the optical adhesive layer 400.

The optical adhesive layer 400 may be formed of a resin composition that has excellent tackiness and transparency, and may be cured by ultraviolet rays, heat, or the like.

As described with reference to the touch screens 100 of FIGS. 2 and 100a of FIG. 3, the display device 1000 according to the embodiment of the present disclosure can prevent appearance quality degradation that may be caused by a surface step difference of the touch screen 100 and durability and reliability degradation that may be caused by a low adhesion force between the flexible circuit board 80 and the pads 60.

According to one embodiment, the reinforcing member 94 may have a double-sided adhesive property. The reinforcing member 94 may be formed of an insulating material that has a strength higher than that of the optical adhesive layer 400. In this case, the adhesive force between the optical adhesive layer 400 and the window member 500 can be more firmly maintained, and the adhesion of the flexible circuit board 80 to the pads 60 can be further increased.

The touch screen 100 of the display device 1000 according to the embodiment may be used as an input device while an image is displayed on the display part 222.

The embodiment of the present disclosure can easily prevent various cosmetic defects such as stains and pressing marks that may occur in a manufacturing process. In addition, the embodiment of the present disclosure can effectively improve electrical contact between the pads 60 and the flexible circuit board 80.

As described above, the exemplary embodiments of the present disclosure have been disclosed through the detailed description with reference to the drawings. It is to be understood that the terminology used herein is for the purpose of describing the present disclosure and is not used to limit the scope of the present disclosure. Therefore, those skilled in the art will appreciate that various modifications and equivalent embodiments are possible without departing from the scope of the present disclosure. Accordingly, the scope of the present disclosure should be determined in a more general sense based on the inventive concepts described herein.

What is claimed is:

1. A touch screen comprising:
   an insulating substrate including a sensing region and a peripheral region;
   a plurality of sensing electrodes disposed in the sensing region of the insulating substrate;
   a plurality of wirings disposed in the peripheral region of the insulating substrate and electrically connected to the plurality of sensing electrodes;
   a plurality of pads disposed in the peripheral region of the insulating substrate and electrically connected to the plurality of wirings;
   an optical film disposed on an upper portion of the plurality of sensing electrodes;
   a flexible circuit board electrically connected to the plurality of pads; and
   a reinforcing member disposed on the flexible circuit board corresponding to the plurality of pads and spaced apart from the optical film,
   wherein a first width of the reinforcing member is greater than a width of the plurality of pads, and
   wherein a first edge of the reinforcing member that faces the optical film vertically aligns with a first edge of the plurality of pads in a cross-sectional view, and the first edge of the reinforcing member coincides with the first edge of the plurality of pads, and
   wherein a second edge of the reinforcing member that is opposite to the first edge of the reinforcing member vertically aligns with an edge of the insulating substrate in the cross-sectional view.

2. The touch screen of claim 1, wherein the optical film is spaced apart from the flexible circuit board by a predetermined distance.

3. The touch screen of claim 1, wherein a thickness of the optical film is greater than that of the reinforcing member.

4. The touch screen of claim 1, wherein the optical film comprises a polarizing film.

5. The touch screen of claim 1, wherein one end of the reinforcing member coincides with an outer edge of the insulating substrate.

6. The touch screen of claim 1, wherein the reinforcing member is a double sided tape.

7. The touch screen of claim 1, wherein the touch screen further comprises an anisotropic conductive film interposed between the plurality of pads and the flexible circuit board.

8. A display device comprising:
   a display panel displaying an image;
   a touch screen disposed on the display panel;
   an optical adhesive layer disposed on the touch screen; and
   a window member disposed on the optical adhesive layer,
   wherein the touch screen comprises:
   an insulating substrate including a sensing region and a first peripheral region;
   a plurality of sensing electrodes disposed in the sensing region of the insulating substrate;
   a plurality of wirings disposed in the first peripheral region of the insulating substrate and electrically connected to the plurality of sensing electrodes;
   a plurality of pads disposed in the first peripheral region of the insulating substrate and electrically connected to the plurality of wirings;
   an optical film disposed on an upper portion of the plurality of sensing electrodes;
   a first flexible circuit board electrically connected to the plurality of pads; and
   a reinforcing member disposed on the first flexible circuit board corresponding to the plurality of pads and spaced apart from the optical film,
   wherein a first width of the reinforcing member is greater than a width of the plurality of pads, and
   wherein a first edge of the reinforcing member that faces the optical film vertically aligns with a first edge of the plurality of pads in a cross-sectional view, and the first edge of the reinforcing member coincides with the first edge of the plurality of pads, and wherein a second edge of the reinforcing member that is opposite to the first edge of the reinforcing member vertically aligns with an edge of the insulating substrate in the cross-sectional view.

9. The display device of claim 8, wherein the optical film is spaced apart from the first flexible circuit board by a predetermined distance.

10. The display device of claim 8, wherein a thickness of the optical film is greater than that of the reinforcing member.

11. The display device of claim 8, wherein the optical film comprises a polarizing film.

12. The display device of claim 8, wherein one end of the reinforcing member coincides with an outer edge of the insulating substrate.

13. The display device of claim 8, wherein the reinforcing member includes an insulating material having a higher strength than the optical adhesive layer.

14. The display device of claim 8, wherein the reinforcing member is a double sided tape.

15. The display device of claim 8, wherein the touch screen further comprises an anisotropic conductive film interposed between the plurality of pads and the first flexible circuit board.

16. The display device of claim 8, wherein the display panel comprises:
   a first insulating substrate including a display region and a second peripheral region;
   a second insulating substrate facing the first insulating substrate;
   a display part disposed between the first insulating substrate and the second insulating substrate and displaying an image; and
   a second flexible circuit board for providing a signal for driving the display part,
   wherein the display region corresponds to the sensing region of the touch screen, and the second peripheral region corresponds to the first peripheral region of the touch screen, and
   wherein the first flexible circuit board of the touch screen is connected to the second flexible circuit board of the display panel.

* * * * *